(12) United States Patent
Wang

(10) Patent No.: US 9,437,590 B2
(45) Date of Patent: Sep. 6, 2016

(54) ELECTROSTATIC DISCHARGE PROTECTION DEVICE AND ELECTROSTATIC DISCHARGE PROTECTION SYSTEM

(71) Applicant: MediaTek Inc., Hsin-Chu (TW)

(72) Inventor: Chang-Tzu Wang, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/608,752

(22) Filed: Jan. 29, 2015

(65) Prior Publication Data

US 2016/0225755 A1  Aug. 4, 2016

(51) Int. Cl.
| | |
|---|---|
| *H02H 9/00* | (2006.01) |
| *H01L 29/66* | (2006.01) |
| *H01L 27/02* | (2006.01) |
| *H01L 29/10* | (2006.01) |
| *H01L 29/04* | (2006.01) |
| *H01L 29/16* | (2006.01) |
| H01L 23/60 | (2006.01) |

(52) U.S. Cl.
CPC ........ *H01L 27/0262* (2013.01); *H01L 27/0248* (2013.01); *H01L 27/0266* (2013.01); *H01L 29/04* (2013.01); *H01L 29/1095* (2013.01); *H01L 29/16* (2013.01); *H01L 23/60* (2013.01)

(58) Field of Classification Search
CPC .......................... H01L 23/60; H01L 27/0248
See application file for complete search history.

(56) References Cited

U.S. PATENT DOCUMENTS

| | | | |
|---|---|---|---|
| 5,751,042 A | 5/1998 | Yu | |
| 7,042,689 B2 | 5/2006 | Chen | |
| 8,279,570 B2 | 10/2012 | Lin et al. | |
| 8,427,796 B2 | 4/2013 | Worley et al. | |
| 8,963,200 B2 * | 2/2015 | Lee | H01L 29/73 257/147 |
| 2002/0132429 A1 | 9/2002 | Chien et al. | |
| 2004/0164354 A1 | 8/2004 | Mergens et al. | |
| 2007/0158748 A1 | 7/2007 | Chu et al. | |
| 2013/0009204 A1 * | 1/2013 | Song | H01L 27/0262 257/119 |
| 2013/0120885 A1 | 5/2013 | Keramat et al. | |
| 2013/0215808 A1 | 8/2013 | Muthukrishnan et al. | |
| 2014/0167105 A1 * | 6/2014 | Salcedo | H01L 27/0262 257/140 |

\* cited by examiner

*Primary Examiner* — David Vu
*Assistant Examiner* — Brandon Fox
(74) *Attorney, Agent, or Firm* — McClure, Qualey & Rodack, LLP

(57) ABSTRACT

An ESD device disposed on a substrate is provided. The ESD device includes a first well, a second well, a first poly-silicon region, a second poly-silicon region and a first protection layer. The first well has a first conductive type and is disposed on the substrate. The second well has a second conductive type, is disposed on the substrate and is adjacent to the first well. The first poly-silicon region is disposed on the first well. The second poly-silicon region is disposed on the second well. The first protection layer covers portions of the first well, the second well, the first poly-silicon region and the second poly-silicon region. There is no doping region in the portions of the first well and the second well which are covered by the first protection layer and between the first poly-silicon region and the second poly-silicon region.

20 Claims, 12 Drawing Sheets

ELECTROSTATIC DISCHARGE PROTECTION DEVICE AND ELECTROSTATIC DISCHARGE PROTECTION SYSTEM

BACKGROUND OF THE INVENTION

1. Field of the Invention

The present inventive concept relates to an electrostatic discharge protection (ESD) device and system. More particularly, the inventive concept relates to a semiconductor controlled rectifier (SCR)-based ESD device for protecting the monitoring device more efficiently.

2. Description of the Related Art

ESD damage has become one of the main reliability concerns of integrated circuit (IC) products. Various electronic devices have been used as ESD protection devices to protect the complementary metal oxide semiconductor (CMOS) integrated circuits from damage. Referring to FIG. 1A and FIG. 1B, the ESD protection systems 100 are illustrated according to the prior art. One diode 110 is arranged between the pad 102 and the pad 104, and another diode 110 is arranged between the pad 102 and the pad 106. Specifically, the pad 102 is an input/output (I/O) pad, the pad 104 is a VDD voltage pad, and the pad 106 is a VSS voltage pad. The analog transceiver 130 is arranged beside the two diodes 110 and between the pads 104 and 106. As shown in FIG. 1A, an ESD path SA is provided to discharge the ESD current for the ESD protection system 100.

FIG. 1B illustrates another ESD protection system 100. As shown in FIG. 1B, two SCR devices 120 are included to replace the two diodes of FIG. 1A. The two SCR devices 120 of FIG. 1B have the same capacitive load as the two diodes 110 of FIG. 1A. However, compared to the ESD protection system 100 of FIG. 1A, another ESD path SB is provided by the ESD protection system 100 of FIG. 1B. Therefore, the ESD protection system 100 of FIG. 1B has better performance and capabilities in discharging the ESD current than the ESD protection system 100 of FIG. 1A. In addition, a power clamp is needed for the ESD protection system 100 of FIG. 1A, but the power clamp is not needed by the ESD protection system 100 of FIG. 1B due to its active turn-on capability.

Regarding the diode 110, since the N/P$^+$ junction is a shallow trench isolation (STI), the current flows in the deep area of the junction. As such, the turn-on speed of the ESD protection system 100 is slow due to the STI of the diode 110. Therefore, another gated diode 200 is provided. FIG. 2 is a schematic diagram illustrating a gated diode 200 according to the prior art. As shown in FIG. 2, the doping regions 220, 222 and 224 are disposed in the well 210. Specifically, the well 210 is an N-type well, the doping regions 220 and 224 are N-type doping regions, and the doping region 222 is a P-type doping region. In addition, the poly-silicon region 230 is disposed on the well 210 and located between the doping regions 220 and 222. The poly-silicon region 232 is disposed on the well 210 and located between the doping regions 222 and 224. Nodes 240, 242 and 244 are disposed on the doping regions 220, 222 and 224 respectively for biasing the gated diode 200. The poly-silicon region 230 is connected to the node 240, and the poly-silicon region 232 is connected to the node 244. For example, node 242 is the anode, and node 244 is the cathode. Since the poly-silicon regions 230 and 232 connect the biasing nodes to the well 210, the current of the gated diode 200 flows in a surface area rather than a deep area. Accordingly, the turn-on speed is improved. However, the capacitive load increases due to the junction between the doping region 222 and the poly-silicon region 230 or 232. In addition, the power clamp is still needed for the gated diode 200.

Therefore, a novel ESD device is needed to increase the turn-on speed without increasing the capacitive load. In addition, when a monitoring device is utilized to monitor the turn-on speed of the ESD device, it is often damaged by the ESD current. As such, protecting the monitoring device is also another problem in designing and manufacturing a novel ESD device.

BRIEF SUMMARY OF THE INVENTION

An electrostatic discharge protection device disposed on a substrate is provided. The electrostatic discharge protection device includes a first well, a second well, a first poly-silicon region, a second poly-silicon region and a first protection layer. The first well has a first conductive type and is disposed on the substrate. The second well has a second conductive type and is disposed on the substrate. The second well is adjacent to the first well, and the second conductive type is different from the first conductive type. The first poly-silicon region is disposed on the first well. A first node connects to the first well through the first poly-silicon region. The second poly-silicon region is disposed on the second well. A second node connects to the second well through the second poly-silicon region. The first protection layer is disposed between the first poly-silicon region and the second poly-silicon region. The first protection layer covers a portion of the first well, a portion of the second well, a portion of the first poly-silicon region and a portion of the second poly-silicon region. There is no doping region in the portions of the first well and the second well which are covered by the first protection layer and between the first poly-silicon region and the second poly-silicon region.

The electrostatic discharge protection device also includes a first doping region, a third node, a second doping region, a fourth node, a third doping region, a fifth node, a fourth doping region, a sixth node, a second protection layer and a third protection layer. The first doping region has a second conductive type and is disposed in the first well. The first doping region is not adjacent to the first poly-silicon region. The third node connects the first doping region. The second doping region has a first conductive type and is disposed in the second well. The second doping region is not adjacent to the second poly-silicon region. The fourth node connects the second doping region. The third doping region has a first conductive type and is disposed in the first well. The third doping region is not adjacent to the first doping region. The fifth node connects the third doping region. The fourth doping region has a second conductive type and is disposed in the second well. The fourth doping region is not adjacent to the second doping region. The sixth node connects the fourth doping region. The second protection layer is disposed between the first doping region and the third doping region. The second protection layer covers a portion of the first well, a portion of the first doping region and a portion of the third doping region. The third protection layer is disposed between the second doping region and the fourth doping region. The third protection layer covers a portion of the second well, a portion of the second doping region and a portion of the fourth doping region.

In one embodiment, the third node connects to an IO pad, the fifth node connects to a first voltage pad, the fourth node and the sixth node connect to a second voltage pad. In another embodiment, the third node and the fifth node connect to a first voltage pad, the fourth node connects to an IO pad, and the sixth node connects to a second voltage pad. In one embodiment, the portion of the first well covered by the first protection layer is equal to the portion of the second well covered by the first protection layer. In another embodiment, the portion of the first well covered by the first protection layer is larger than or smaller than the portion of the second well covered by the first protection layer.

An electrostatic discharge protection device disposed on a substrate is provided. The electrostatic discharge protection includes a first MOS transistor structure, a second MOS transistor structure, a first poly-silicon region, a second poly-silicon region and a first protection layer. The first MOS transistor structure includes a first well, a second well and a first doping region. The first well has a first conductive type and disposed on the substrate. The second well has a second conductive type and disposed on the substrate, wherein the second well is adjacent to the first well, and the second conductive type is different from the first conductive type. The first doping region has a second conductive type and disposed in the first well. The second MOS transistor structure includes the first well, the second well, and a second doping region. The second doping region has a first conductive type and is disposed in the second well. The first poly-silicon region is disposed on the first well. The second poly-silicon region is disposed on the second well. The first protection layer is disposed between the first poly-silicon region and the second poly-silicon region. The first protection layer covers a portion of the first well, a portion of the second well, a portion of the first poly-silicon region and a portion of the second poly-silicon region. There is no doping region in the portions of the first well and the second well which are covered by the first protection layer and between the first poly-silicon region and the second poly-silicon region.

An electrostatic discharge protection system is provided. The electrostatic discharge protection system includes an electrostatic discharge protection device The electrostatic discharge protection is coupled between a first voltage pad, a second voltage pad and an IO pad. The electrostatic discharge protection includes a substrate, a first well, a second well, a first poly-silicon region, a second poly-silicon region and a first protection layer. The first well has a first conductive type and disposed on the substrate. The second well has a second conductive type and disposed on the substrate. The second well is adjacent to the first well, and the second conductive type is different from the first conductive type. The first poly-silicon region is disposed on the first well. A first node connects to the first well through the first poly-silicon region. The second poly-silicon region is disposed on the second well. A second node connects to the second well through the second poly-silicon region. The first protection layer is disposed between the first poly-silicon region and the second poly-silicon region. The first protection layer covers a portion of the first well, a portion of the second well, a portion of the first poly-silicon region and a portion of the second poly-silicon region. There is no doping region in the portions of the first well and the second well which are covered by the first protection layer and between the first poly-silicon region and the second poly-silicon region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3:
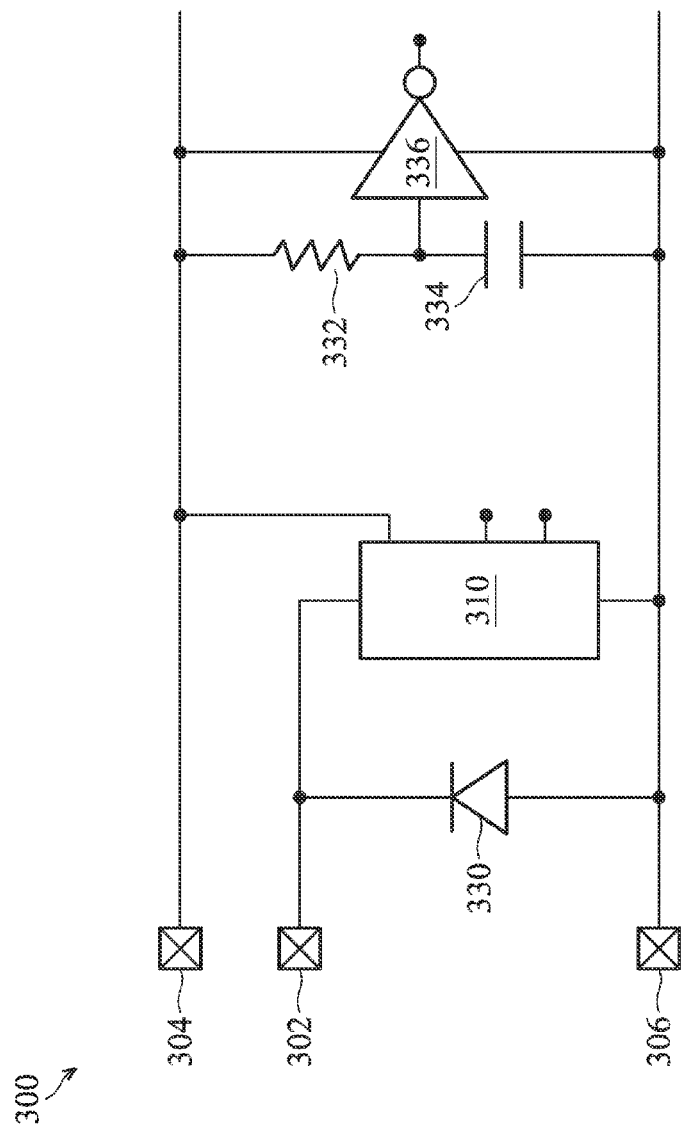
FIG. 3 is a schematic diagram illustrating an ESD protection system according to the present invention.

FIG. 3 is a schematic diagram illustrating an ESD protection system 300 according to the present invention. As shown in FIG. 3, the ESD protection system 300 includes three pads 302, 304 and 306, an ESD protection device 310, a diode 330, a resistor 332, a capacitor 334 and an operational amplifier 336. Specifically, the pad 302 is an input/output (I/O) pad, the pad 304 is a VDD voltage pad (first voltage pad), and the pad 306 is a VSS voltage pad (second voltage pad). The ESD protection device 310 and the diode 330 are arranged between the pads 302 and 306 and arranged in parallel with each other. The ESD protection device 310 further connects to the pad 304, the node PTR and the node NTR. The operational amplifier 336 is arranged between the nodes NTR and PTR.

Figure 4:
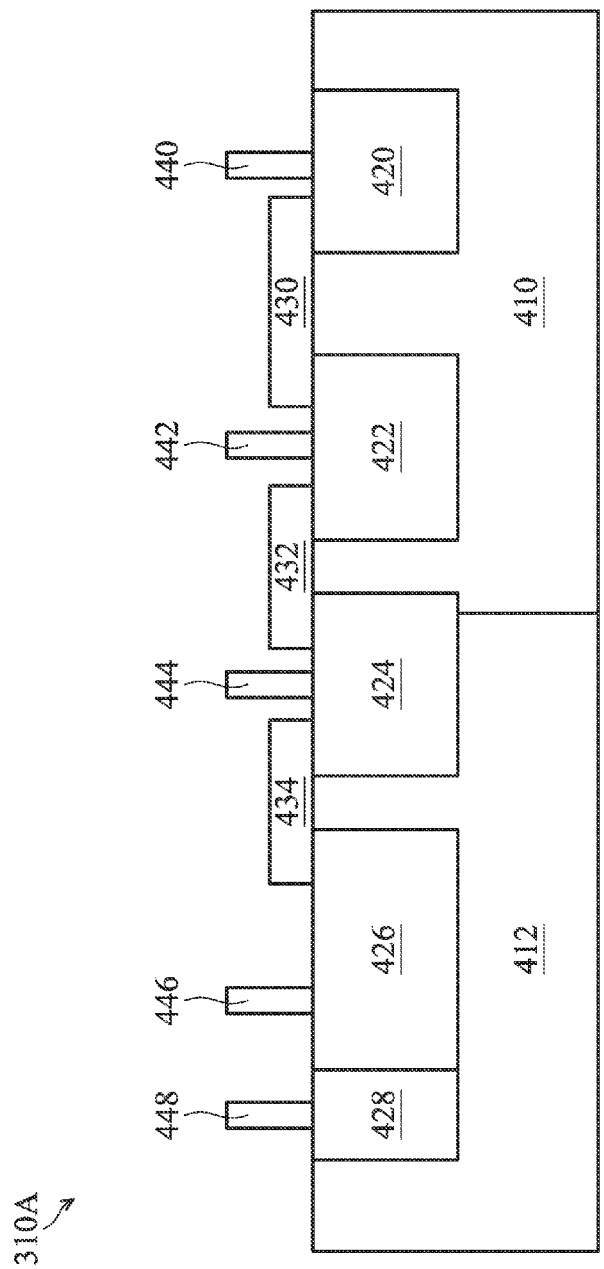
FIG. 4 is a schematic diagram illustrating an ESD protection device according to the present invention.

FIG. 4 is a schematic diagram illustrating an ESD protection device 310A according to the present invention. In one embodiment, the doping regions 420 and 422 are disposed in the well 410, the doping region 424 is disposed in the wells 410 and 412, and the doping regions 426 and 428 are disposed in the well 412. The wells 410 and 412 are disposed in a substrate (not shown). For example, the well 410 is an N-type well, the well 412 is a P-type well, the doping regions 420 and 426 are N-type, and the doping regions 422, 426, 428 are P-type. Nodes 440, 442, 444, 446 and 448 are disposed on the doping regions 420, 422, 424, 426 and 428. In addition, the protection layer 430 is disposed on the well 410 and between the nodes 440 and 442, the protection layer 432 is disposed on the well 410 and between the nodes 442 and 444, and the protection layer 434 is disposed on the well 412 and between the nodes 444 and 446.

Figure 1A:
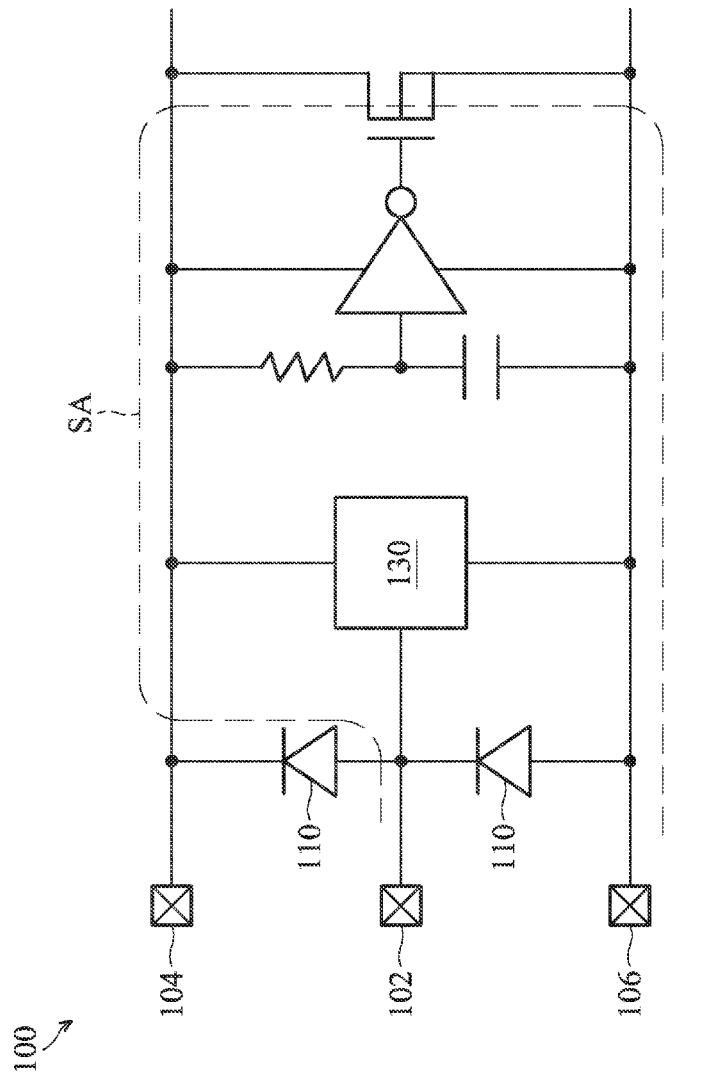
FIG. 1A is a schematic diagram illustrating an ESD protection system according to the prior art.
Figure 1B:
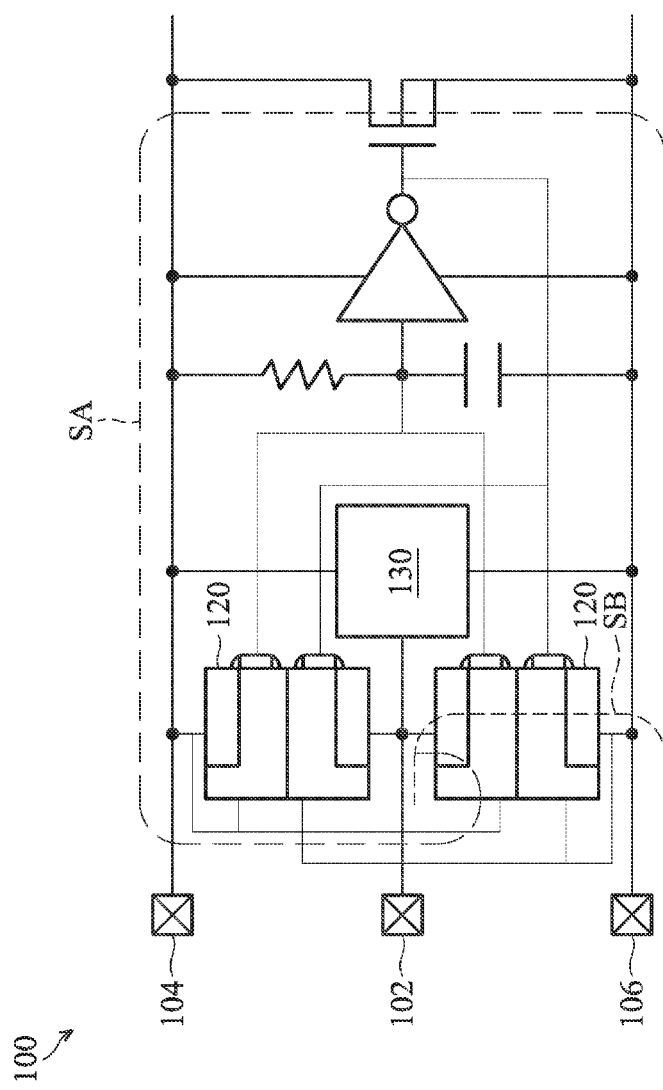
FIG. 1B is another schematic diagram illustrating an ESD protection system according to the prior art.
Figure 2:
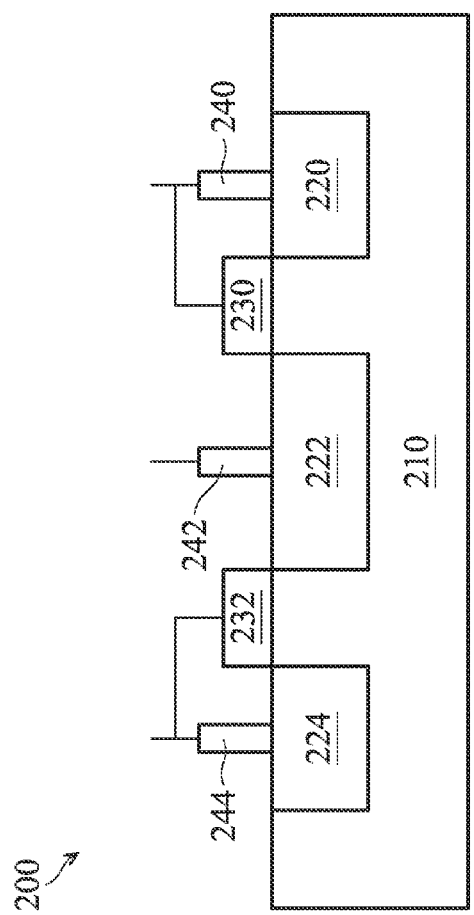
FIG. 2 is a schematic diagram illustrating a gated diode according to the prior art.

When the ESD protection device 310A is arranged on the ESD protection system 300, the nodes 440 and 442 are connected to the VDD voltage pad 304 and the I/O pad 302 respectively, the node 444 is connected to the node PTR, and the nodes 446 and 448 are connected to the VSS voltage pad 306. The path of the ESD current starts from the node 442, and passes through the doping region 422, the wells 410, 420 and the doping region 426. More specifically, the protection layers 430, 432 and 434 are resistance protection oxide (RPO). Compared to the ESD protection device 200 as shown in FIG. 2, the ESD protection device 310A of FIG. 4 provides a smaller capacitive load than the ESD protection device 200. In addition, the power clamp is not needed for the ESD protection device 310A.

Figure 5:
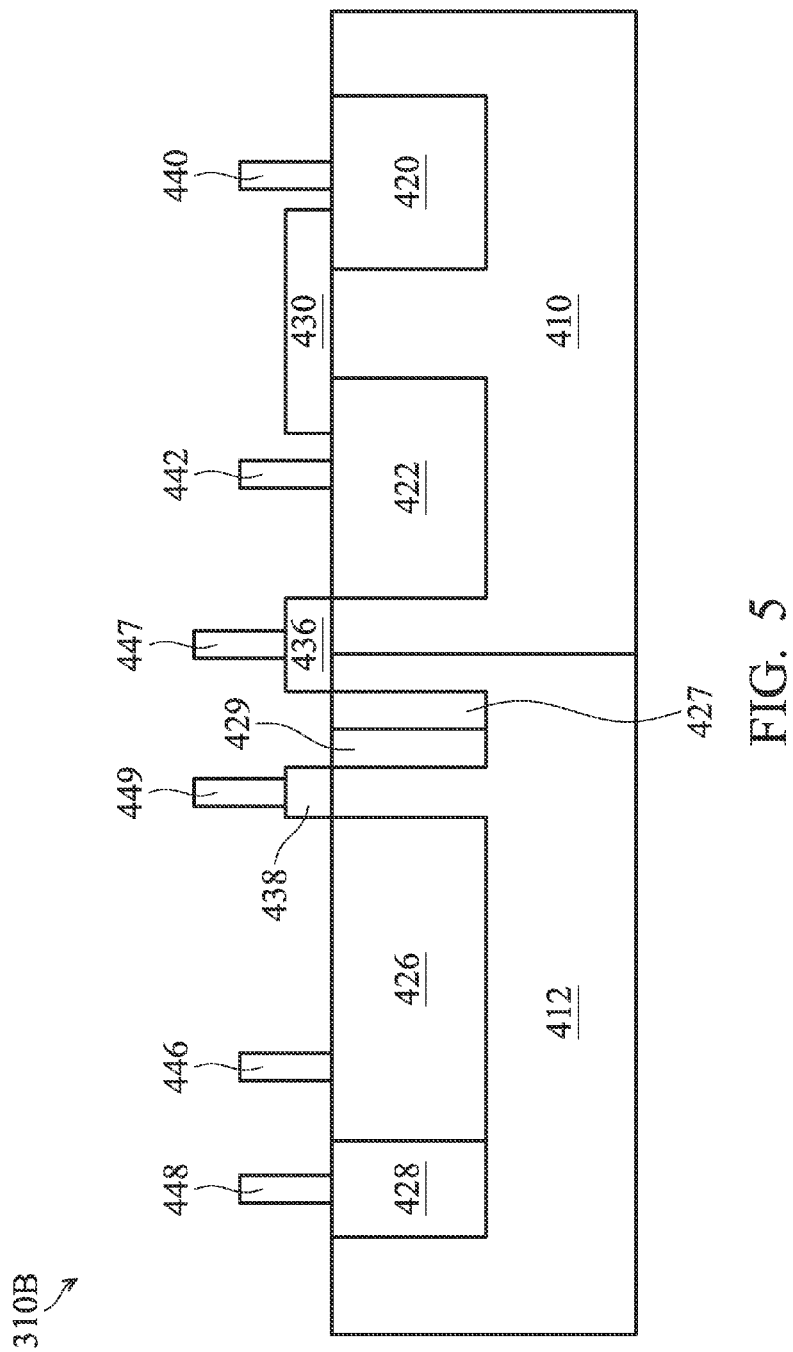
FIG. 5 is another schematic diagram illustrating an ESD protection device according to the present invention.

FIG. 5 is another schematic diagram illustrating an ESD protection device 310B according to the present invention. In one embodiment, the doping regions 420 and 422 are disposed in the well 410, the doping region 426, 427, 428, 429 are disposed in the well 412. The wells 410 and 412 are disposed in a substrate (not shown). For example, the well 410 is an N-type well, the well 412 is a P-type well, the doping regions 420, 426 and 429 are N-type, and the doping regions 422, 427 and 428 are P-type. The poly-silicon region 436 is disposed on the wells 410 and 412, and it is also disposed between the doping regions 422 and 427. The poly-silicon region 438 is disposed on the well 412 and between the doping regions 426 and 429. Nodes 440, 442, 446 and 448 are disposed on the doping regions 420, 422, 426 and 428. In addition, the protection layer 430 is disposed on the well 410 and between the nodes 440 and 442. Furthermore, the nodes 440 and 442 are connected to the VDD voltage pad 304 and the I/O pad 302 respectively, the node 447 is connected to the node TP, the node 449 is connected to the node TN, and the nodes 446 and 448 are connected to the VSS voltage pad 306.

Regarding the ESD protection device 310B as shown in FIG. 5, the nodes 447 and 449 are trigger nodes for biasing the gates through the poly-silicon regions 436 and 438. The P-type doping region 427 and the N-type doping region 429 are disposed between the poly-silicon regions 436 and 438. Accordingly, the P-type doping region 422, the N-type well 410 and the P-type doping region 427 forms or constitutes a MOS transistor structure. In addition, the N-type doping region 429, the P-type well 412 and the N-type doping region 426 constitute another MOS transistor structure. When the two MOS transistor structures are turned-on, the ESD currents are bypassed in a surface area and results in a high turn-on speed of the ESD protection device 310B. Compared to the ESD protection device 200 as shown in FIG. 2, the ESD protection device 310B of FIG. 5 provides a smaller capacitive load than the ESD protection device 200. The power clamp is not needed for the ESD protection device 310B.

Figure 6:
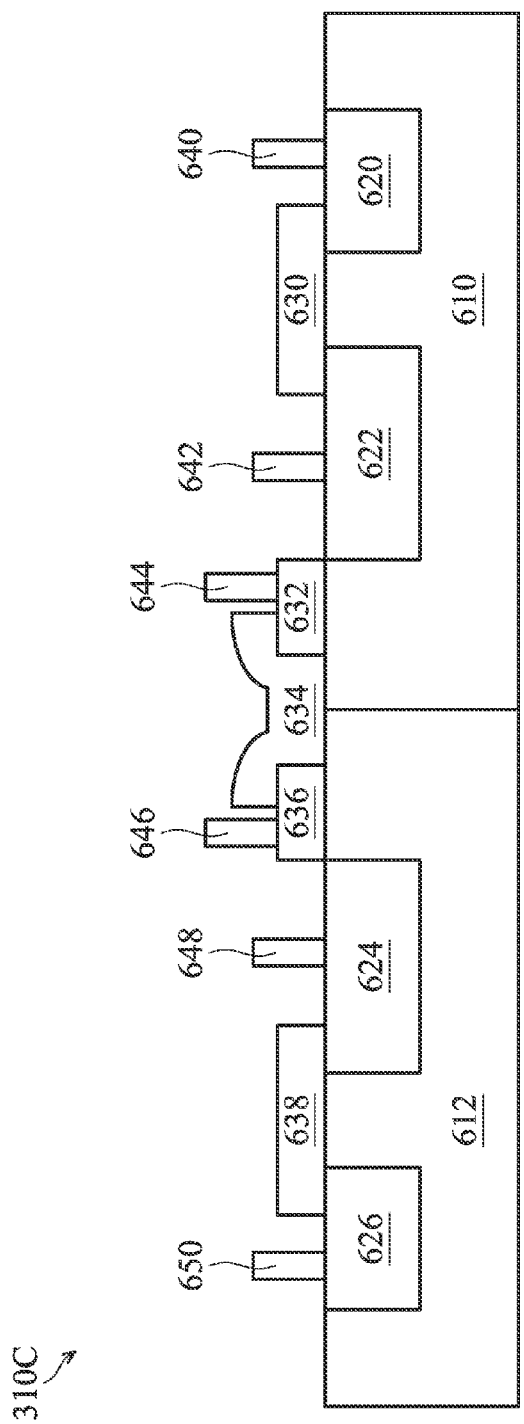
FIG. 6 is a schematic diagram illustrating an ESD protection device according to the present invention.

FIG. 6 is a schematic diagram illustrating an ESD protection device 310C according to the present invention. In one embodiment, the ESD protection device 310C includes two wells 610 (first well) and 612 (second well), two poly-silicon regions 632 (first poly-silicon region) and 636 (second poly-silicon region) and a protection layer 634 (first protection layer). The well 610 is N-type (first conductive type) and disposed on a substrate (not shown). The well 612 is P-type (second conductive type) and disposed on the substrate. The well 612 is adjacent to the well 611. The poly-silicon region 632 is disposed on the well 610. The node 644 (first node) connects to the well 610 through the poly-silicon region 632. The poly-silicon region 636 is disposed on the well 612. The node 646 (second node) connects to the well 612 through the poly-silicon region 636. The protection layer 634 is disposed between the poly-silicon regions 632 and 636. The protection layer 634 covers a portion of the well 610, a portion of the well 612, a portion of the poly-silicon region 632 and a portion of the poly-silicon region 636. There is no doping region in the portions of the wells 610 and 612 which are covered by the protection layer 634 and between the poly-silicon regions 632 and 636.

As shown in FIG. 6, the ESD protection device 310C also includes a doping region 622 (first doping region) of P-type and disposed in the well 610. It should be noted that the doping region 622 is not adjacent to the poly-silicon region 632. In other words, the doping region 622 does not contact with the poly-silicon region 632. The node 642 (third node) connects the doping region 622. The doping region 624 (second doping region) is N-type and disposed in the well 612, and the doping region 624 is not adjacent to the poly-silicon region 636. The node 648 (fourth node) connects the doping region 624. In addition, the ESD protection device 310C also includes a doping region 620 (third doping region) of N-type disposed in the well 610. The doping region 620 is not adjacent to the doping region 622. The node 640 (fifth node) connects the doping region 620. The doping region 626 (fourth doping region) of P-type is disposed in the well 612. The doping region 626 is not adjacent to the doping region 624. The node 650 (sixth node) connects the doping region 626. Furthermore, the protection layer 630 (second protection layer) is disposed between the doping regions 620 and 622. The protection layer 630 covers a portion of the well 610, a portion of the doping region 622 and a portion of the doping region 620. The protection layer 638 (third protection layer) is disposed between the doping regions 624 and 626. The protection layer 638 covers a portion of the well 612, a portion of the doping region 624 and a portion of the doping region 626.

When the ESD protection device 310C is arranged as a P-type device in the ESD protection system 300 of FIG. 3, the node 644 is connected to the node NTR, the node 646 is connected to the node PTR, the node 640 is connected to the VDD voltage pad 640 (first voltage pad), the node 642 is connected to the I/O pad 642, and the nodes 648 and 650 are connected to the VSS voltage pad 650 (second voltage pad). When the ESD protection device 310C is arranged as a N-type device in the ESD protection system 300 of FIG. 3, the node 644 is connected to the node NTR, the node 646 is connected to the node PTR, the nodes 640 and 642 are connected to the VDD voltage pad 640, the node 648 is connected to the I/O pad 642, and the node 650 is connected to the VSS voltage pad 650. As such, the unique structure of the ESD protection device 310 can be utilized as an N-type device or a P-type device. It does not need to provide two different structures of ESD protection devices 310C for an N-type device and a P-type device. Therefore, the ESD protection devices 310C of the present invention are easily accessed and implemented.

It should be noted that, in one embodiment, a minimum space is arranged between the two poly-silicon regions 632 and 636 without doping regions. The minimum space between the two poly-silicon regions 632 and 636 can be well controlled or gate biased by the nodes NTR and PTR. Accordingly, the channel current of the ESD protection device 310C has a punch effect. In addition, the P-type doping region 622, the N-type well 610 and the P-type well 612 constitutes or forms a MOS transistor structure (first MOS transistor structure). The N-type well 610, the P-type well 612 and the N-type doping region 624 constitutes or forms another MOS transistor structure (second MOS transistor structure). More specifically, the first and second MOS transistor structures are laterally diffused metal oxide semiconductor (LDMOS). Therefore, the channel current can be turned on earlier to improve the turn-on speed of the ESD protection device 310C.

Figure 7:
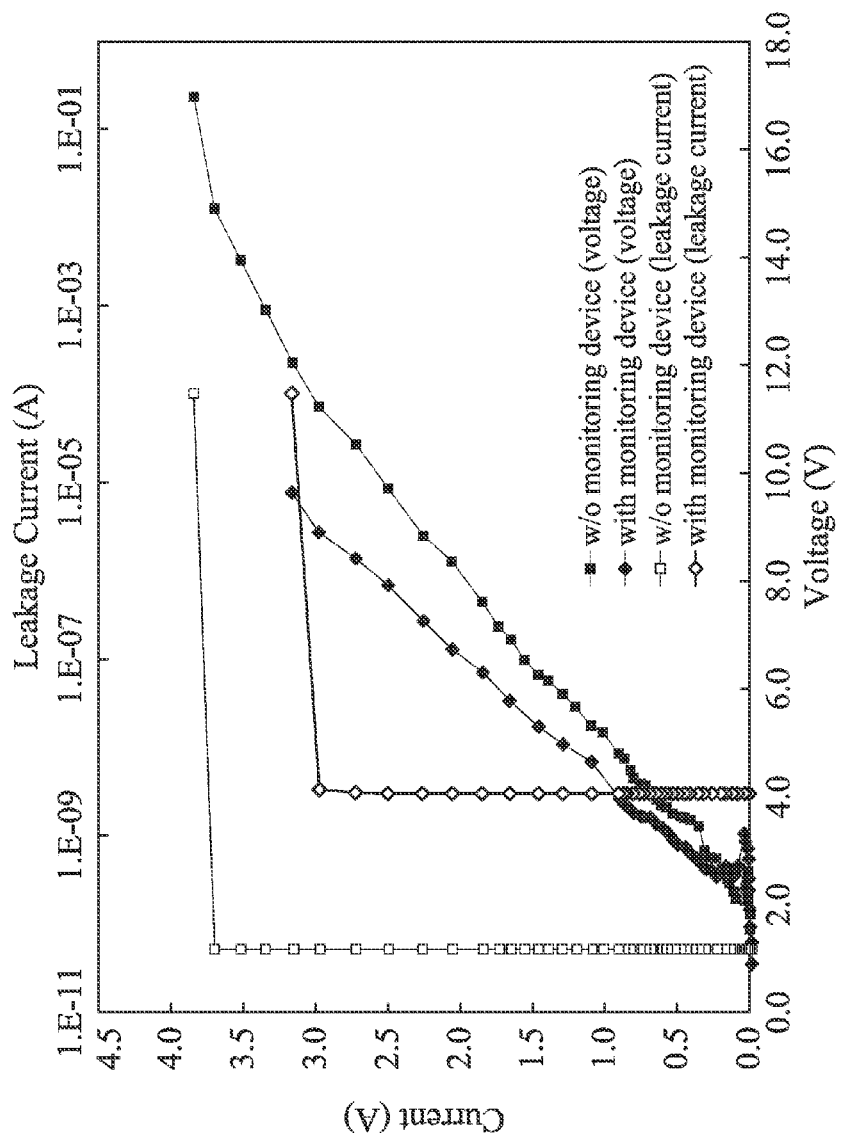
FIG. 7 is a schematic diagram illustrating the I-V characteristics of an ESD protection device according to the present invention.

FIG. 7 is a schematic diagram illustrating the I-V characteristics of an ESD protection device 310C according to the present invention. Regarding the leakage currents for the ESD protection device 310C with and without the monitoring device, the ESD protection device 310C with the monitoring device is failed at the current of about 3 A, and the ESD protection device 310C without the monitoring device is failed at the current of about 3.7 A. The ESD protection device 310C provides a better performance and capability for protecting the monitoring device due to the minimum space between the two poly-silicon regions 632 and 636. More specifically, because there is no doping region between the two poly-silicon regions 632 and 636, a minimum space is achieved accordingly. Therefore, the monitoring device will not be over-shot and will be protected by the ESD protection device 310C. In addition, the turn-on speed is also improved due to the structure of the two LDMOS arranged within the ESD protection device 310C. Therefore, not only a fast turn-on speed but also a high reliability for protecting the monitoring device is provided by the ESD protection device 310C.

Figure 8A:
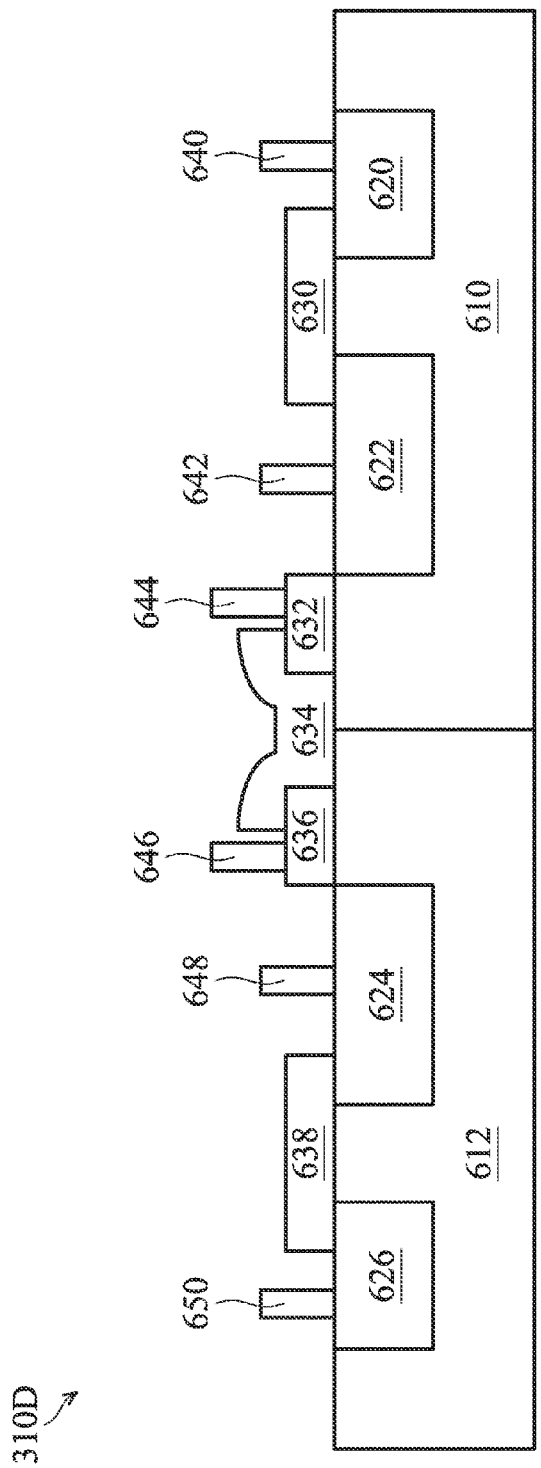
FIG. 8A is a schematic diagram illustrating an ESD protection device according to the present invention.
Figure 8B:
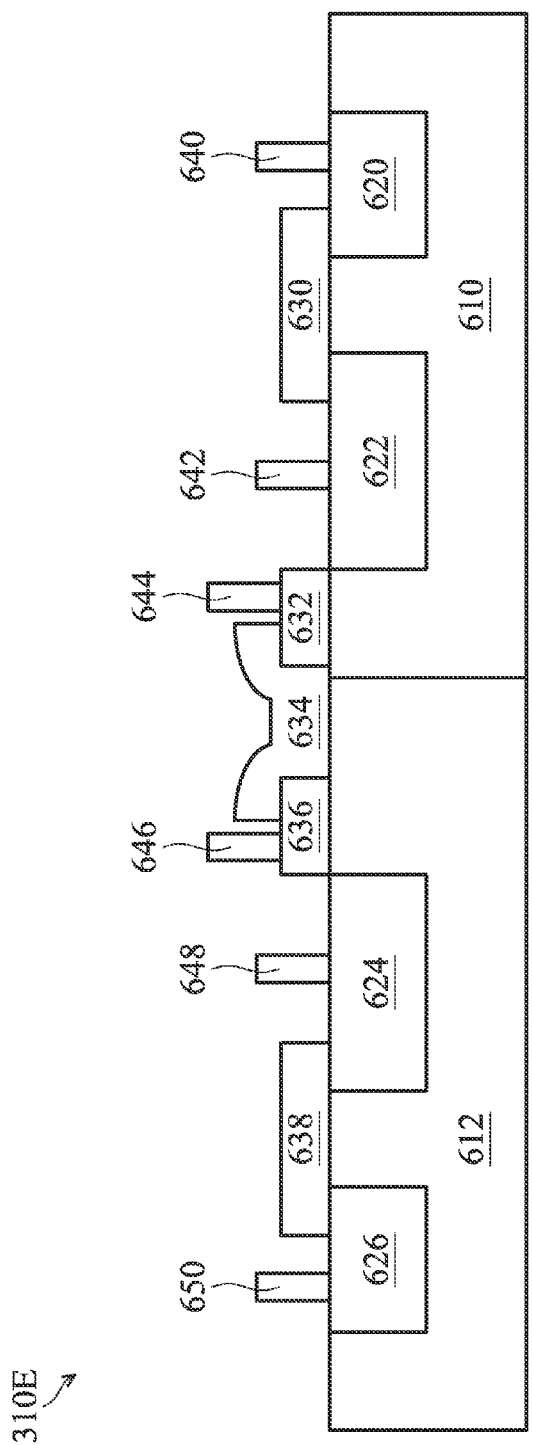
FIG. 8B is another schematic diagram illustrating an ESD protection device according to the present invention.
Figure 8C:
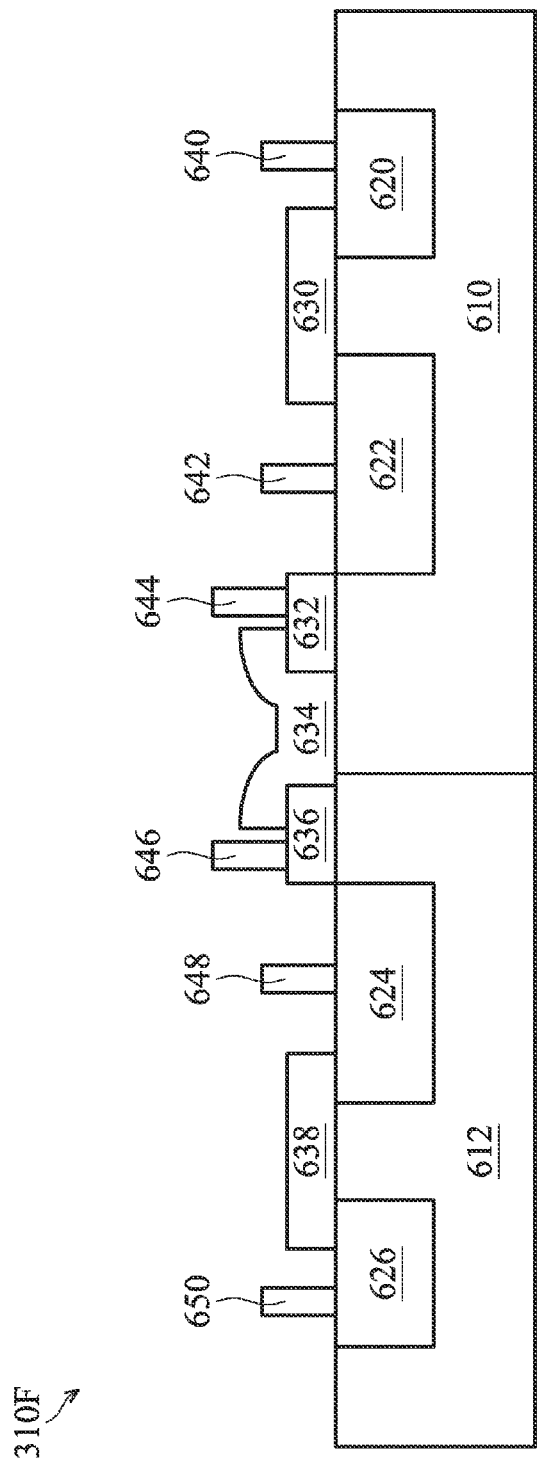
FIG. 8C is another schematic diagram illustrating an ESD protection device according to the present invention.
Figure 9:
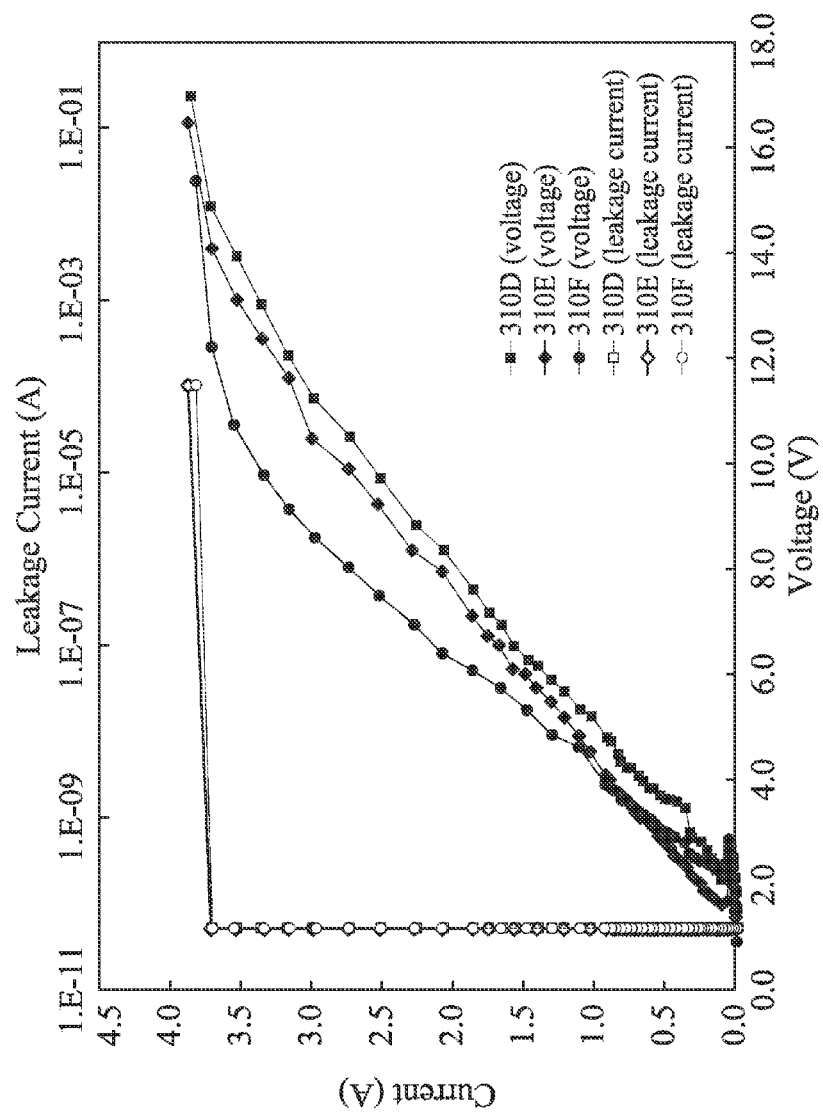
FIG. 9 is a schematic diagram illustrating the I-V characteristics of an ESD protection device according to the present invention.

FIG. 8A is a schematic diagram illustrating an ESD protection device 310D according to the present invention. The structure of the ESD protection device 310D is similar to the ESD protection device 310C of FIG. 6, however, in this embodiment, the portion of the well 610 covered by the protection layer 634 is equal to the portion of the well 612 covered by the protection layer 634. FIGS. 8B and 8C are schematic diagrams illustrating ESD protection devices 310E and 310F according to the present invention. In the embodiment of the ESD protection device 310E as shown in FIG. 8B, the portion of the well 610 covered by the protection layer 634 is smaller than the portion of the well 612 covered by the protection layer 634. In the embodiment of the ESD protection device 310F as shown in FIG. 8C, the portion of the well 610 covered by the protection layer 634 is larger than the portion of the well 612 covered by the protection layer 634. FIG. 9 is a schematic diagram illustrating the I-V characteristics of ESD protection devices 310D, 310E and 310F according to the present invention. Regarding the leakage currents for the ESD protection devices 310D, 310E and 310 without the monitoring device, the ESD protection devices 310D, 310E and 310 are failed at the current of about 3.7 A. Therefore, high reliable capabilities and fast turn-on speeds are provided by the ESD protection devices 310D, 310E and 310.

Although embodiments of the present disclosure and their advantages have been described in detail, it should be understood that various changes, substitutions and alterations can be made herein without departing from the spirit and scope of the disclosure as defined by the appended claims. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments is within the scope of the disclosure.

What is claimed is:

1. An electrostatic discharge protection device disposed on a substrate, comprising:
   a first well, having a first conductive type and disposed on the substrate;
   a second well, having a second conductive type and disposed on the substrate, wherein the second well is adjacent to the first well, and the second conductive type is different from the first conductive type;
   a first poly-silicon region, disposed on the first well, wherein a first node connects to the first well through the first poly-silicon region;
   a second poly-silicon region, disposed on the second well, wherein a second node connects to the second well through the second poly-silicon region; and
   a first protection layer, disposed between the first poly-silicon region and the second poly-silicon region, wherein the first protection layer covers a portion of the first well, a portion of the second well, a portion of the first poly-silicon region and a portion of the second poly-silicon region, and there is no doping region in the portions of the first well and the second well which are covered by the first protection layer and between the first poly-silicon region and the second poly-silicon region.

2. The electrostatic discharge protection device as claimed in claim 1, further comprising:
   a first doping region, having a second conductive type and disposed in the first well, wherein the first doping region is not adjacent to the first poly-silicon region;
   a third node, connecting the first doping region;
   a second doping region, having a first conductive type and disposed in the second well, wherein the second doping region is not adjacent to the second poly-silicon region; and
   a fourth node, connecting the second doping region.

3. The electrostatic discharge protection device as claimed in claim 2, further comprising:
   a third doping region, having a first conductive type and disposed in the first well, wherein the third doping region is not adjacent to the first doping region;
   a fifth node, connecting the third doping region;

a fourth doping region, having a second conductive type and disposed in the second well, wherein the fourth doping region is not adjacent to the second doping region; and a sixth node, connecting the fourth doping region.

4. The electrostatic discharge protection device as claimed in claim 3, further comprising:

a second protection layer, disposed between the first doping region and the third doping region, wherein the second protection layer covers a portion of the first well, a portion of the first doping region and a portion of the third doping region; and a third protection layer, disposed between the second doping region and the fourth doping region, wherein the third protection layer covers a portion of the second well, a portion of the second doping region and a portion of the fourth doping region.

5. The electrostatic discharge protection device as claimed in claim 3, wherein the third node connects to an IO pad, the fifth node connects to a first voltage pad, the fourth node and the sixth node connect to a second voltage pad.

6. The electrostatic discharge protection device as claimed in claim 3, wherein the third node and the fifth node connect to a first voltage pad, the fourth node connects to an IO pad, and the sixth node connects to a second voltage pad.

7. The electrostatic discharge protection device as claimed in claim 1, wherein the portion of the first well covered by the first protection layer is equal to the portion of the second well covered by the first protection layer.

8. The electrostatic discharge protection device as claimed in claim 1, wherein the portion of the first well covered by the first protection layer is larger than or smaller than the portion of the second well covered by the first protection layer.

9. An electrostatic discharge protection device disposed on a substrate, comprising:

a first MOS transistor structure, comprising:
 a first well, having a first conductive type and disposed on the substrate;
 a second well, having a second conductive type and disposed on the substrate, wherein the second well is adjacent to the first well, and the second conductive type is different from the first conductive type; and
 a first doping region, having a second conductive type and disposed in the first well;

a second MOS transistor structure, comprising:
 the first well;
 the second well; and
 a second doping region, having a first conductive type and disposed in the second well;

a first poly-silicon region, disposed on the first well;
a second poly-silicon region, disposed on the second well; and
a first protection layer, disposed between the first poly-silicon region and the second poly-silicon region, wherein the first protection layer covers a portion of the first well, a portion of the second well, a portion of the first poly-silicon region and a portion of the second poly-silicon region, and there is no doping region in the portions of the first well and the second well which are covered by the first protection layer and between the first poly-silicon region and the second poly-silicon region.

10. The electrostatic discharge protection device as claimed in claim 9, further comprising:

a first node, connected to the first well through the first poly-silicon region;

a second node, connected to the second well through the second poly-silicon region;

a third node, connected to the first doping region; and a fourth node, connected to the second doping region, wherein the first doping region is not adjacent to the first poly-silicon region, and the second doping region is not adjacent to the second poly-silicon region.

11. The electrostatic discharge protection device as claimed in claim 10, further comprising:

a third doping region, having a first conductive type and disposed in the first well, wherein the third doping region is not adjacent to the first doping region;

a fifth node, connected to the third doping region;

a fourth doping region, having a second conductive type and disposed in the second well, wherein the fourth doping region is not adjacent to the second doping region; and a sixth node, connected to the fourth doping region.

12. The electrostatic discharge protection device as claimed in claim 11, further comprising:

a second protection layer, disposed between the first doping region and the third doping region, wherein the second protection layer covers a portion of the first well, a portion of the first doping region and a portion of the third doping region; and a third protection layer, disposed between the second doping region and the fourth doping region, wherein the third protection layer covers a portion of the second well, a portion of the second doping region and a portion of the fourth doping region.

13. The electrostatic discharge protection device as claimed in claim 11, wherein the third node connects to an IO pad, the fifth node connects to a first voltage pad, the fourth node and the sixth node connect to a second voltage pad.

14. The electrostatic discharge protection device as claimed in claim 11, wherein the third node and the fifth node connect to a first voltage pad, the fourth node connects to an IO pad, and the sixth node connects to a second voltage pad.

15. The electrostatic discharge protection device as claimed in claim 9, wherein the portion of the first well covered by the first protection layer is equal to the portion of the second well covered by the first protection layer.

16. The electrostatic discharge protection device as claimed in claim 9, wherein the portion of the first well covered by the first protection layer is larger than or smaller than the portion of the second well covered by the first protection layer.

17. An electrostatic discharge protection system, comprising:

an electrostatic discharge protection device, coupled between a first voltage pad, a second voltage pad and an IO pad, wherein the electrostatic discharge protection comprises:
 a substrate;
 a first well, having a first conductive type and disposed on the substrate;
 a second well, having a second conductive type and being disposed on the substrate, wherein the second well is adjacent to the first well, and the second conductive type is different from the first conductive type;
 a first poly-silicon region, disposed on the first well, wherein a first node connects to the first well through the first poly-silicon region;

a second poly-silicon region, disposed on the second well, wherein a second node connects to the second well through the second poly-silicon region; and a first protection layer, disposed between the first poly-silicon region and the second poly-silicon region, wherein the first protection layer covers a portion of the first well, a portion of the second well, a portion of the first poly-silicon region and a portion of the second poly-silicon region, and there is no doping region in the portions of the first well and the second well which are covered by the first protection layer and between the first poly-silicon region and the second poly-silicon region.

18. The electrostatic discharge protection system as claimed in claim 17, further comprising:

a first doping region, having a second conductive type and disposed in the first well, wherein the first doping region is not adjacent to the first poly-silicon region;

a third node, connected to the first doping region;

a second doping region, having a first conductive type and disposed in the second well, wherein the second doping region is not adjacent to the second poly-silicon region; and a fourth node, connecting the second doping region.

19. The electrostatic discharge protection system as claimed in claim 18, further comprising:

a third doping region, having a first conductive type and disposed in the first well, wherein the third doping region is not adjacent to the first doping region;

a fifth node, connecting the third doping region;

a fourth doping region, having a second conductive type and disposed in the second well, wherein the fourth doping region is not adjacent to the second doping region; and a sixth node, connecting the fourth doping region.

20. The electrostatic discharge protection system as claimed in claim 19, further comprising:

a second protection layer, disposed between the first doping region and the third doping region, wherein the second protection layer covers a portion of the first well, a portion of the first doping region and a portion of the third doping region; and a third protection layer, disposed between the second doping region and the fourth doping region, wherein the third protection layer covers a portion of the second well, a portion of the second doping region and a portion of the fourth doping region.

* * * * *